(12) United States Patent
Vanderberg et al.

(10) Patent No.: US 6,903,350 B1
(45) Date of Patent: Jun. 7, 2005

(54) ION BEAM SCANNING SYSTEMS AND METHODS FOR IMPROVED ION IMPLANTATION UNIFORMITY

(75) Inventors: Bo H. Vanderberg, Gloucester, MA (US); Andrew M. Ray, Newburyport, MA (US); Kevin W. Wenzel, Belmont, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/865,061

(22) Filed: Jun. 10, 2004

(51) Int. Cl.[7] ............................................. H01L 21/324
(52) U.S. Cl. ............................. 250/492.21; 250/492.1; 250/492.2; 250/492.22; 250/492.23; 250/492.3; 250/442.11
(58) Field of Search .......................... 250/492.1–492.3, 250/492.21–492.23, 442.11, 398, 396 R, 396 ML

(56) References Cited

U.S. PATENT DOCUMENTS

| | | |
|---|---|---|
| 4,283,631 A | 8/1981 | Turner |
| 4,494,005 A | 1/1985 | Shibata et al. |
| 4,593,200 A | 6/1986 | McGuire, III |
| 4,661,712 A | 4/1987 | Mobley |
| 4,736,107 A | 4/1988 | Myron |
| 4,804,852 A | 2/1989 | Rose et al. |
| 4,851,693 A | 7/1989 | Fisher |
| 5,091,655 A | 2/1992 | Dykstra et al. |
| 5,160,846 A | 11/1992 | Ray |
| 5,177,366 A | 1/1993 | King et al. |
| 5,373,164 A | 12/1994 | Benveniste |
| 5,406,088 A | 4/1995 | Brune et al. |
| 5,432,352 A | 7/1995 | van Bavel |
| 5,760,405 A * | 6/1998 | King et al. ............. 250/423 R |
| 5,780,863 A | 7/1998 | Benveniste et al. |
| 5,825,038 A * | 10/1998 | Blake et al. ............ 250/492.21 |
| 5,838,112 A | 11/1998 | Tsukakoshi et al. |
| 6,075,249 A | 6/2000 | Olson |
| 6,130,436 A * | 10/2000 | Renau et al. ............ 250/492.21 |
| 6,191,427 B1 | 2/2001 | Kase et al. |
| 6,207,963 B1 | 3/2001 | Benveniste |
| 6,498,348 B2 * | 12/2002 | Aitken ............... 250/396 ML |
| 6,521,895 B1 | 2/2003 | Walther et al. |
| 6,580,083 B2 | 6/2003 | Berrian |
| 6,633,040 B1 | 10/2003 | Pfeiffer et al. |
| 6,690,022 B2 | 2/2004 | Larsen et al. |
| 6,770,888 B1 * | 8/2004 | Benveniste et al. .. 250/396 ML |
| 2002/0050569 A1 | 5/2002 | Berrian |
| 2002/0066872 A1 * | 6/2002 | Nishihashi et al. ..... 250/492.21 |
| 2002/0175297 A1 | 11/2002 | Scheuer et al. |
| 2003/0042427 A1 * | 3/2003 | Sullivan et al. ............. 250/397 |
| 2003/0190822 A1 * | 10/2003 | Nakasuji ..................... 438/795 |

FOREIGN PATENT DOCUMENTS

WO    WO 01/51183 A1    7/2001

OTHER PUBLICATIONS

"NV–6208: A Midcurrent Ion Implanter with Constant Beam Angle of Incidence", Jimmy I. Fleming, Jerald P. Dykstra, Monty I. King, Andy M. Ray and Robert B. Simonton, Nuclear Instruments and Methods in Physics Research BJ7/38, 1989, pp. 601–604.

* cited by examiner

Primary Examiner—John R. Lee
Assistant Examiner—Bernard E. Souw
(74) Attorney, Agent, or Firm—Eschweiler & Associates LLC

(57) ABSTRACT

Ion implantation systems and scanning systems therefor are provided, in which focus adjustment apparatus is provided to dynamically adjust a focal property of an ion beam to compensate for at least one time varying focal property of a scanner. Methods are provided for providing a scanned ion beam to a workpiece, comprising dynamically adjusting a focal property of an ion beam, scanning the ion beam to create a scanned ion beam, and directing the scanned ion beam toward a workpiece.

45 Claims, 12 Drawing Sheets

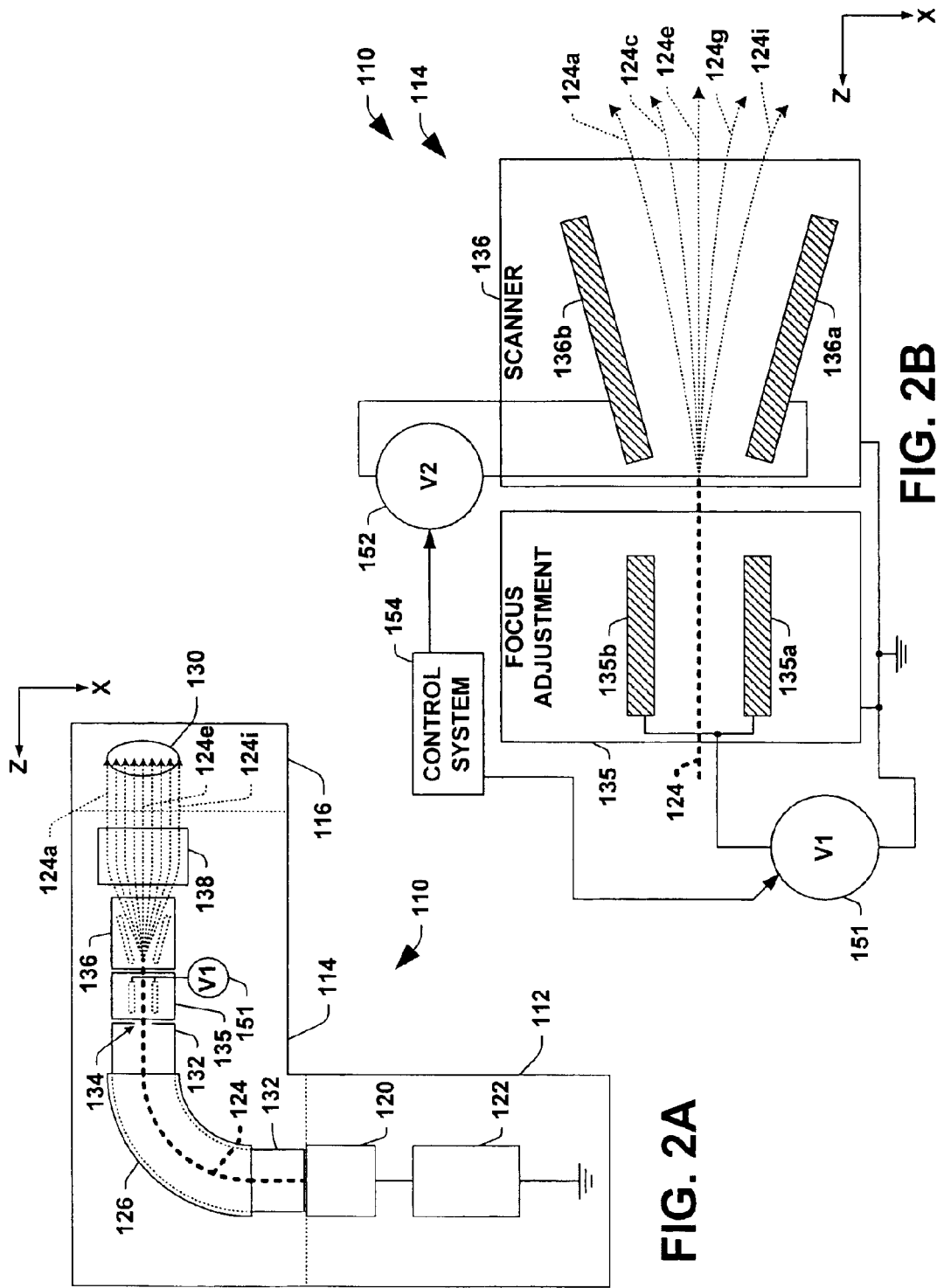

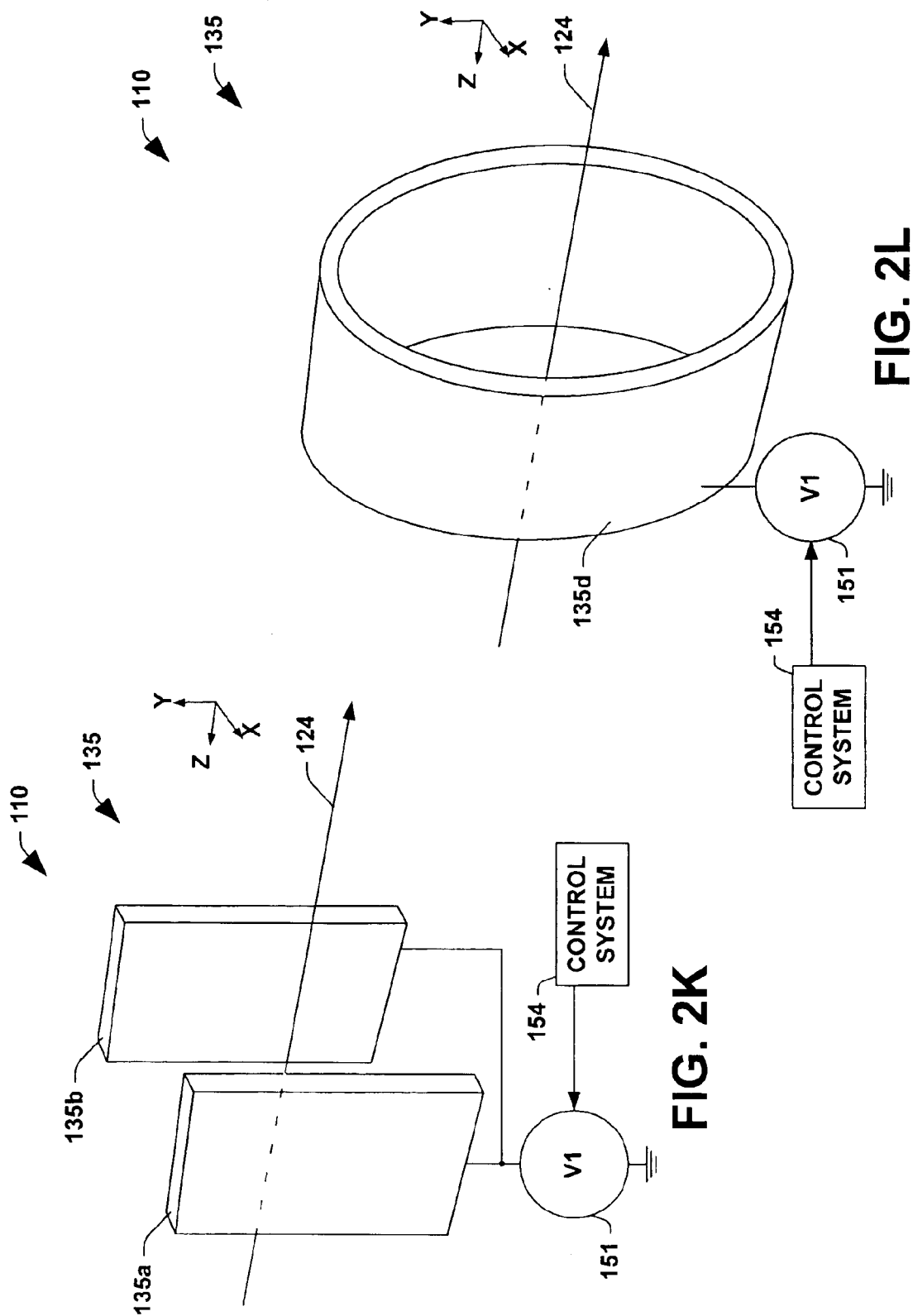

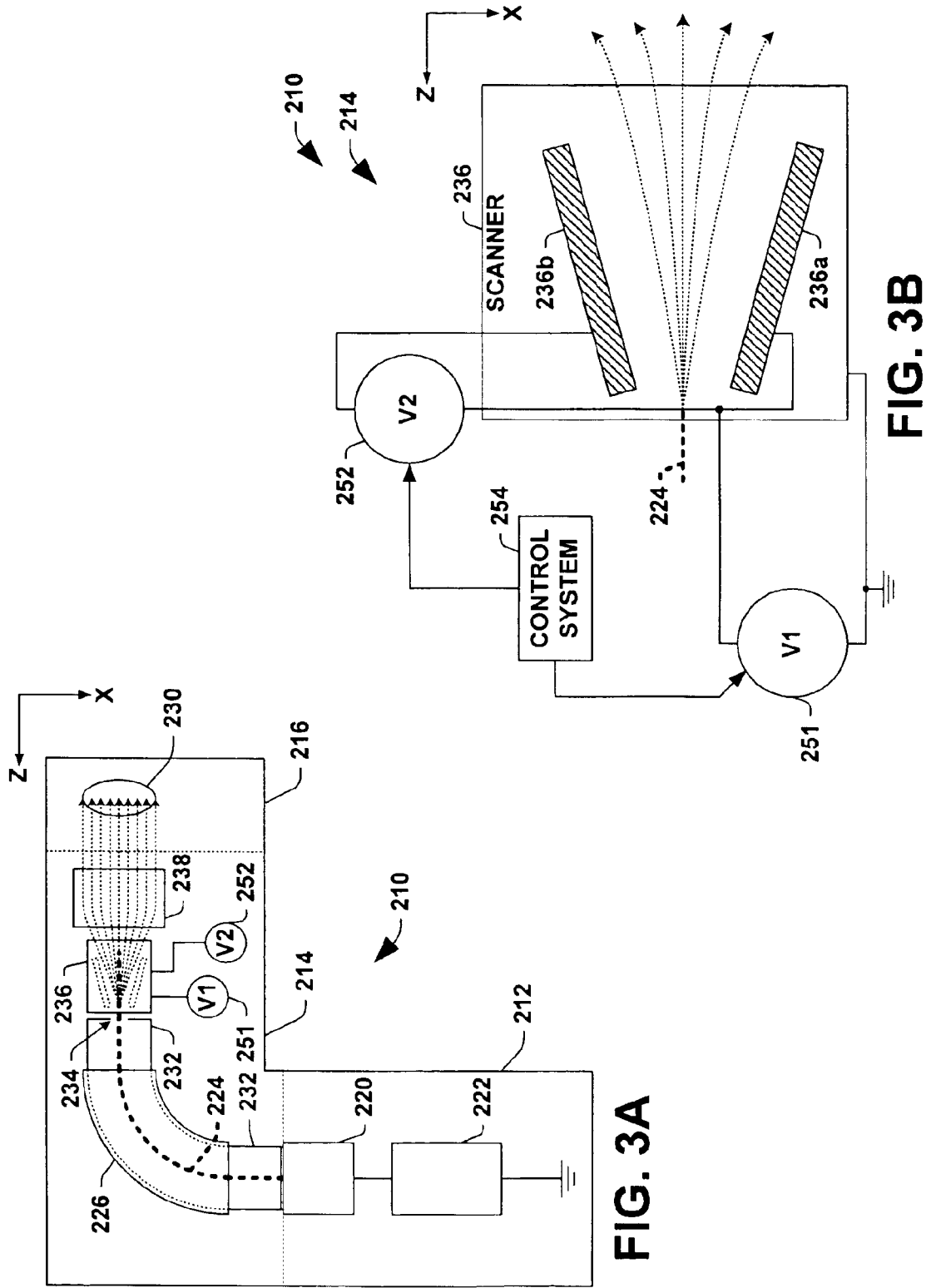

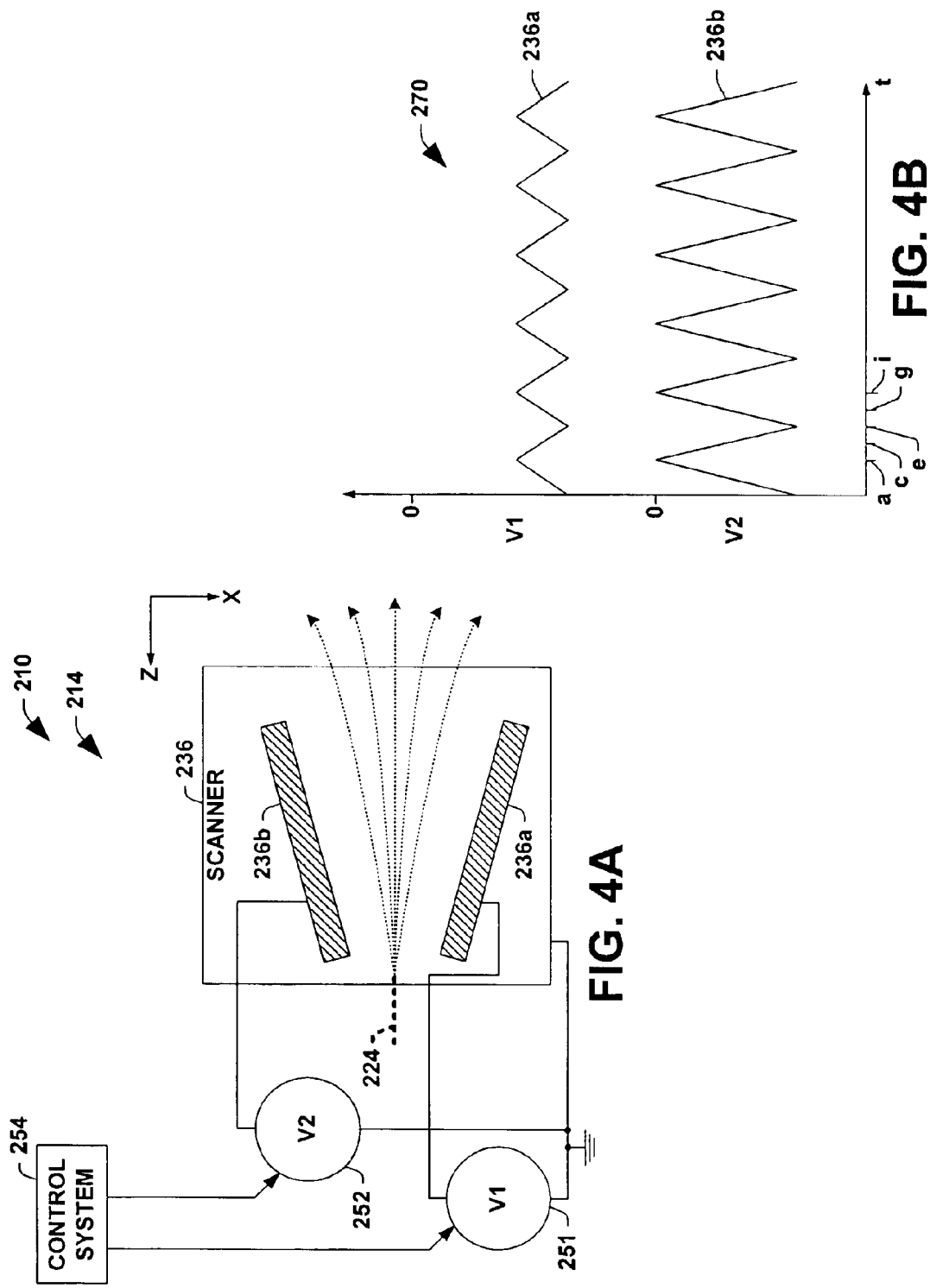

ION BEAM SCANNING SYSTEMS AND METHODS FOR IMPROVED ION IMPLANTATION UNIFORMITY

FIELD OF THE INVENTION

The present invention relates generally to ion implantation systems, and more specifically to improved systems and methods for uniformly scanning ion beams across a workpiece.

BACKGROUND OF THE INVENTION

In the manufacture of semiconductor devices and other products, ion implantation is used to dope semiconductor wafers, display panels, or other workpieces with impurities. Ion implanters or ion implantation systems treat a workpiece with an ion beam, to produce n or p-type doped regions or to form passivation layers in the workpiece. When used for doping semiconductors, the ion implantation system injects a selected ion species to produce the desired extrinsic material, wherein implanting ions generated from source materials such as antimony, arsenic or phosphorus results in n type extrinsic material wafers, and implanting materials such as boron, gallium or indium creates p type extrinsic material portions in a semiconductor wafer.

FIG. 1A illustrates an exemplary ion implantation system 10 having a terminal 12, a beamline assembly 14, and an end station 16. The terminal 12 includes an ion source 20 powered by a high voltage power supply 22 that produces and directs an ion beam 24 to the beamline assembly 14. The beamline assembly 14 consists of a beamguide 32 and a mass analyzer 26 in which a dipole magnetic field is established to pass only ions of appropriate charge-to-mass ratio through a resolving aperture 34 at an exit end of the beamguide 32 to a workpiece 30 (e.g., a semiconductor wafer, display panel, etc.) in the end station 16. The ion source 20 generates charged ions that are extracted from the source 20 and formed into the ion beam 24, which is directed along a beam path in the beamline assembly 14 to the end station 16. The ion implantation system 10 may include beam forming and shaping structures extending between the ion source 20 and the end station 16, which maintain the ion beam 24 and bound an elongated interior cavity or passageway through which the beam 24 is transported to one or more workpieces 30 supported in the end station 16. The ion beam transport passageway is typically evacuated to reduce the probability of ions being deflected from the beam path through collisions with air molecules.

Low energy implanters are typically designed to provide ion beams of a few thousand electron volts (keV) up to around 80–100 keV, whereas high energy implanters can employ linear acceleration (linac) apparatus (not shown) between the mass analyzer 26 and the end station 16, so as to accelerate the mass analyzed beam 24 to higher energies, typically several hundred keV, wherein DC acceleration is also possible. High energy ion implantation is commonly employed for deeper implants in the workpiece 30. Conversely, high current, low energy ion beams 24 are typically employed for high dose, shallow depth ion implantation, in which case the lower energy of the ions commonly causes difficulties in maintaining convergence of the ion beam 24.

In the manufacture of integrated circuit devices and other products, it is desirable to uniformly implant the dopant species across the entire workpiece 30. Different forms of end stations 16 are found in conventional implanters. "Batch" type end stations can simultaneously support multiple workpieces 30 on a rotating support structure, wherein the workpieces 30 are rotated through the path of the ion beam until all the workpieces 30 are completely implanted. A "serial" type end station, on the other hand, supports a single workpiece 30 along the beam path for implantation, wherein multiple workpieces 30 are implanted one at a time in serial fashion, with each workpiece 30 being completely implanted before implantation of the next workpiece 30 begins.

The implantation system 10 of FIG. 1A includes a serial end station 16, wherein the beamline assembly 14 includes a lateral scanner 36 that receives the ion beam 24 having a relatively narrow profile (e.g., a "pencil" beam), and scans the beam 24 back and forth in the X direction to spread the beam 24 out into an elongated "ribbon" profile, having an effective X direction width that is at least as wide as the workpiece 30. The ribbon beam 24 is then passed through a parallelizer 38 that directs the ribbon beam toward the workpiece 30 generally parallel to the Z direction (e.g., generally perpendicular to the workpiece surface). Although the terminal 12, the beamline assembly 14, and the end station 16 are illustrated as separate or discrete systems, one or more of these may be combined or components thereof may be shared, for example, wherein the terminal 12 may extend to include or encompass the beamguide 32, and other beamline assembly components through the parallelizer 38.

Referring also to FIGS. 1B–1E, the scanner 36 is illustrated in FIG. 1B, having a pair of scan plates or electrodes 36a and 36b on either lateral side of the beam path, and a voltage source 50 that provides alternating voltages to the electrodes 36a and 36b, as illustrated in a waveform diagram 60 in FIG. 1C. The time-varying voltage potential between the scan electrodes 36a and 36b creates a time varying electric field across the beam path therebetween, by which the beam 24 is bent or deflected (e.g., scanned) along a scan direction (e.g., the X direction in FIGS. 1A, 1B, and 1C–1J). When the scanner electric field is in the direction from the electrode 36a to the electrode 36b (e.g., the potential of electrode 36a is more positive than the potential of electrode 36b, such as at times "a" and "c" in FIG. 1C), the positively charged ions of the beam 24 are subjected to a lateral force in the negative X direction (e.g., toward the electrode 36b). When the electrodes 36a and 36b are at the same potential (e.g., zero electric field in the scanner 36, such as at time "e" in FIG. 1C), the beam 24 passes through the scanner 35 unmodified. When the field is in the direction from the electrode 36b to the electrode 36a (e.g., times "g" and "i" in FIG. 1C), the positively charged ions of the beam 24 are subjected to a lateral force in the positive X direction (e.g., toward the electrode 36a).

FIG. 1B shows the scanned beam 24 deflection as it passes through the scanner 36 at several exemplary discrete points in time during scanning prior to entering the parallelizer 38 and FIG. 1D illustrates the beam 24 impacting the workpiece 30 at the corresponding times indicated in FIG. 1C. The scanned and parallelized ion beam 24a in FIG. 1D corresponds to the applied electrode voltages at the time "a" in FIG. 1C, and subsequently, the beam 24b–24i is illustrated in FIG. 1D for scan voltages at corresponding times "c", "e", "g", and "i" of FIG. 1C for a single generally horizontal scan across the workpiece 30 in the X direction. FIG. 1E illustrates a simplified scanning of the beam 24 across the workpiece 30, wherein mechanical actuation (not shown) translates the workpiece 30 in the positive Y direction during X direction scanning by the scanner 36, whereby the beam 24 is imparted on the entire exposed surface of the workpiece 30.

Prior to scanning in the scanner 36, the ion beam 24 typically has a width and height profile of non-zero X and Y dimensions, respectively, and may not be truly symmetrical (e.g., may have a non-unity aspect ratio of Y/X dimensions), wherein one or both of the X and Y dimensions of the beam vary during transport. As the beam 24 is transported along the beam path toward the workpiece 30, the beam 24 encounters various electric and/or magnetic fields and devices that may alter the beam width and/or height. In addition, space charge effects, including mutual repulsion of positively charged beam ions, tend to diverge the beam (e.g., increased X and Y dimensions), absent countermeasures.

With respect to the beam 24 that is actually provided to the workpiece, the geometry and operating voltages of the scanner 36 provide certain focusing properties with respect to the ion beam 24. Even assuming a perfectly symmetrical beam 24 (e.g., a pencil beam) entering the scanner 36, if the scanner focusing properties are such that the focal distance of the scanner 36 and the parallelizer 38 provide a focal distance equal to the distance from the effective vertex of the scanner 36 to the workpiece 30 at the outermost scanned edges in the X direction, the bending of the beam 24 by the scanner 36 changes the beam focusing, wherein the incident beam typically is focused only at the lateral edges in the X direction (e.g., 24$a$ and 24$i$ inn FIG. 1D), and will be unfocused (e.g., wider or more divergent) in the X dimension for points between the lateral edges (e.g., 24$c$, 24$e$, and 24$g$ in FIG. 1D).

FIGS. 1F–1J illustrate the incident beam 24 corresponding to the scanned instances 24$a$, 24$c$, 24$e$, 24$g$, and 24$i$, respectively. As the beam 24 is scanned across the wafer 30 in the X direction, the X direction focusing of the scanner 36 varies, leading to increased lateral defocusing of the incident beam 24 as it moves toward the center, and then improved focusing as the beam 24 again reaches the other lateral edge. In this case, the focal length of the scanner 36 is essentially set to the distance the beam 24 travels from the vertex of the scanner 36 to either of the outermost edges in the X direction (e.g., beams 24$a$ and 24$i$). In this case, for no scanning, the beam 24$e$ proceeds directly to the center of the workpiece 30, at which the incident beam 24$e$ has an X direction width $W_C$, as shown in FIG. 1H. As the beam 24 is scanned laterally in either direction away from the center, however, the time varying focusing properties of the scanner 36 lead to stronger and stronger lateral focusing of the incident beam. For instance, at the outermost edges of the workpiece 30, the incident beam 24$a$ in FIG. 1F has a first left side width $W_{L1}$, and on the right side, the incident beam 24$i$ in FIG. 1J has a first right side width $W_{R1}$. FIGS. 1G and 1I illustrate two intermediate beams 24$c$ and 24$g$ having incident beam widths $W_{L2}$ and $W_{R2}$, respectively, showing X direction focal variation between the edges and the center of the workpiece 30.

In order to counteract the focal variation of the scanner 36 along the scan direction, conventional ion implantation system designs often provide a fairly long distance between the scanner 36 and the wafer 30, whereby the dimensional variation of the scan direction beam dimension (e.g., X dimension) is small. However, as implantation uniformity specifications are increased for ion implanters, such focal variation becomes less and less tolerable. Furthermore, for high current, low energy ion beams 24, long drift distances between the scanner 36 and the workpiece 30 are more prone to beam blowup due to mutual repulsion of the beam ions. Therefore, there is a continuing need for improved ion implantation systems and scanning systems by which the time varying focal properties of beam scanning apparatus can be controlled or improved.

SUMMARY OF THE INVENTION

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

The present invention is related to ion implantation systems, scanning systems, and methods for providing scanned ion beams to a workpiece, in which one or more focusing properties of an ion beam are adjusted or corrected dynamically to compensate for a time varying focal property of a scanning mechanism. The invention finds utility in any type of ion implantation application, and may be advantageously employed to mitigate incident beam variations along a scan direction, thereby improving implantation uniformity in implanted workpieces.

In accordance with an aspect of the invention, an ion implantation system is provided, that comprises an ion source, a mass analyzer, and a focus adjustment apparatus receiving an ion beam along a beam path from the mass analyzer. The system further comprises a scanner receiving a focus adjusted ion beam from the focus adjustment apparatus, which directs a scanned ion beam toward a workpiece. The focus adjustment apparatus dynamically adjusts a focal property of the ion beam to compensate for at least one time varying focal property of the scanner. In one implementation, the focus adjustment apparatus comprises a single electrode (e.g., an Einzel lens) surrounding the beam path upstream of the scanner that creates a time varying electric field that counteracts or otherwise compensates for the time varying scanner focal properties. Other implementations provide multiple electrode focus adjustment apparatus upstream of the scanner to create one or more time varying electric fields for focal property compensation. In further possible implementations, the focus adjustment apparatus comprises electromagnets located upstream of the scanner that create time varying magnetic fields near the beam to correct for the scanner focal property variations during scanning.

Another aspect of the invention relates to a scanning system for providing a scanned ion beam to a workpiece in an ion implantation system. The scanning system comprises a scanner receiving an ion beam along a beam path and directing a scanned ion beam toward a workpiece, and a focus adjustment apparatus that dynamically adjusts a focal property of the scanned ion beam to compensate for at least one time varying focal property of the scanner.

Yet another aspect of the invention relates to a method of providing a scanned ion beam to a workpiece. The method comprises providing an ion beam along a beam path, dynamically adjusting a focal property of the ion beam, scanning the ion beam to create a scanned ion beam, and directing the scanned ion beam toward a workpiece.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIG. 2A is a schematic diagram illustrating an exemplary ion implantation system having a scanning system with a scanner and focus adjustment apparatus in accordance with one or more aspects of the present invention;

FIG. 2B is a top plan view illustrating the exemplary scanning system and an ion beam being scanned along a scan direction in the ion implantation system of FIG. 2A;

FIG. 2K is a simplified perspective view illustrating two exemplary focus adjustment electrodes located on opposite sides of the ion beam path in the exemplary focus adjustment apparatus of FIGS. 2A and 2B;

FIG. 2L is a perspective view illustrating another focus adjustment apparatus in accordance with the invention, comprising an Einzel lens surrounding the ion beam path;

FIGS. 3A and 3B are simplified top plan views illustrating an ion implantation system having another exemplary scanning system comprising a scanner with two scanning electrodes and focus adjustment apparatus that provides a time varying common mode voltage to the scanning electrodes in accordance with the invention;

FIG. 4A is a top plan view illustrating another scanning system in accordance with the invention, comprising two scanning electrodes and two separate power sources;

FIG. 4B is a graph illustrating scanning plate voltage waveforms in the scanning system of FIG. 4A.

DETAILED DESCRIPTION OF THE INVENTION

Figure 1B:
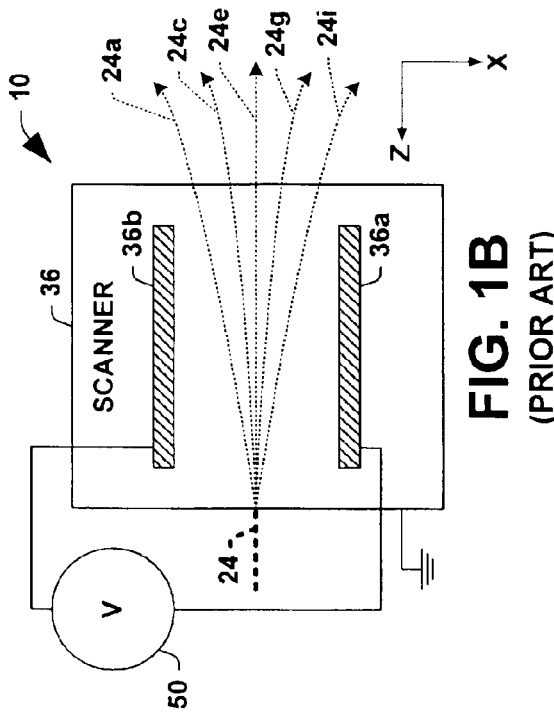
FIG. 1B is a partial top plan view illustrating the scanner of the implantation system of FIG. 1B and several exemplary scanned ion beams.

The present invention will now be described with reference to the drawings wherein like reference numerals are used to refer to like elements throughout, and wherein the illustrated structures are not necessarily drawn to scale. The invention provides focus adjustment apparatus for ion implantation systems to compensate for one or more time varying focal properties of a scanner, as well as methods for providing a scanned ion beam to a workpiece. Although illustrated and described below in the context of exemplary low energy ion implantation systems, the invention may alternatively be employed in high or medium energy ion implanters, which may include acceleration components. In addition, while illustrated below in systems having so-called serial end stations, the invention may also be employed in ion implantation systems having batch end-stations, wherein all such variant implementations are contemplated as falling within the scope of the present invention and the appended claims.

FIGS. 2A, 2B, and 2K illustrate an exemplary low energy ion implantation system or ion implanter 110 with a scanner 136 and focus correction or adjustment apparatus 135 in accordance with the invention. As illustrated in FIG. 2A, the ion implantation system 110 comprises a terminal 112, a beamline assembly 114, and an end station 116. An ion source 120 in the terminal 112 is powered by a power supply 122 to provide an extracted ion beam 124 to the beamline assembly 114, wherein the source 120 includes one or more extraction electrodes (not shown) to extract ions from the source chamber and thereby to provide the extracted ion beam 124 to the beamline assembly 114.

The beamline assembly 114 comprises a beamguide 132 having an entrance near the source 120 and an exit with an exit aperture 134, as well as a mass analyzer 126 that receives the extracted ion beam 124 and creates a dipole magnetic field to pass only ions of appropriate charge-to-mass ratio or range thereof (e.g., a mass analyzed ion beam 124 having ions of a desired mass range) through the resolving aperture 134 to a workpiece 130 in the end station 116. Various beam forming and shaping structures (not shown) may be provided in the beamline assembly to maintain the ion beam 124 and which bound an elongated interior cavity or passageway through which the beam 124 is transported along a beam path to one or more workpieces 130 supported in the end station 116. The illustrated end station 116 is a "serial" type end station that supports a single workpiece 130 along the beam path for implantation (e.g., a semiconductor wafer, display panel, or other workpiece to be implanted with ions from the beam 124), although batch or other type end stations may alternatively be employed within the scope of the invention.

The beamline assembly 114 further comprises a scanning system with a scanner 136 and a focus adjustment or correction apparatus 135 in accordance with one or more aspects of the invention, as well as a parallelizer 138. In operation, the focus adjustment apparatus 135 receives the mass analyzed ion beam 124 along the beam path from the mass analyzer 126 and provides a focus adjusted ion beam 124 along the beam path to the scanner 136.

The scanner 135 receives the focus adjusted beam 124 that has a relatively narrow profile (e.g., a "pencil" beam in the illustrated system 110). The scanner scans the beam 124 back and forth in the X direction to spread the beam 124 out into an elongated "ribbon" profile (e.g., a scanned beam 124), having an effective X direction width that is at least as wide as the workpiece 130. The ribbon beam 124 is then passed through the parallelizer 138 that directs the ribbon beam toward the workpiece 130 generally parallel to the Z direction (e.g., generally perpendicular to the workpiece surface), although angled implants are also contemplated by the present invention.

In accordance with the invention, the focus adjustment apparatus 135 dynamically adjusts a focal property of the focus adjusted ion beam 124 to compensate for at least one time varying focal property of the scanner 136. In this manner, the lateral (e.g., X direction) beam width remains generally uniform across the laterally scanned workpiece 130, as illustrated further below in FIGS. 2F–2J. In the example of FIGS. 2A–2J, the focus adjustment apparatus 135 generates time varying electric fields proximate the mass analyzed ion beam 124 that operate to dynamically adjust the focal property of the focus adjusted ion beam 124 that is provided to the scanner 136.

As illustrated in FIG. 2B, the exemplary focus adjustment apparatus 135 comprises a pair of conductive focus adjustment electrodes or plates 135a and 135b positioned on either lateral side of the beam path, which extend generally parallel to the beam path. The focus adjustment apparatus 135 also includes a power source 151 coupled with the electrodes 135a and 135b, which provides a time varying (e.g., common mode) potential to the focus adjustment electrodes, thereby creating electric fields between the plates 135a and 135b and the grounded enclosure or housing thereof, and as illustrated in a waveform diagram 160 in FIG. 2C. The power source V1 151 may be programmable or may be controlled by a control system 154 to provide the voltage waveforms illustrated and described hereinafter. At the entrance and exit ends of the focus adjustment electrodes 135a and 135b, electric field lines extend between the grounded focus adjustment apparatus housing and the electrodes 135a and 135b, which fields operate to initially diverge the beam 124 as it enters the portion of the beam path between the electrodes 135a and 135b, and then converge the beam 124 as it leaves the electrodes 135a and 135b.

In the illustrated implementation, the focus adjustment electrodes 135a and 135b are biased negatively with a time varying focus adjustment voltage (V1 in FIG. 2C) by the power source 151 with respect to the external environment (e.g., with respect to the grounded housing), whereby the ions are attracted to the negative correction plates, and the beam tends to diverge in the X directions at the entrance. Then at the exit, the beam will converge because it is repelled from the environment back towards the negatively biased focus adjustment electrodes 135a and 135b. In this example, the electrode biasing and the resulting entrance and exit electric fields vary with time, such that the focal adjustment of the apparatus 135 is time varying.

The resulting focus adjusted beam 124 is then provided to the scanner 136 downstream of the focus adjustment apparatus 135 along the beam path. The scanner 136 then scans the focus adjusted ion beam along a scan direction axis (e.g., the X direction in the illustrated system 110) that is generally perpendicular to the beam path, wherein the scanner 136 scans the beam 124 at a scan frequency, as illustrated in FIG. 2C. In the illustrated implementation, the scanner 136 comprises a pair of scan plates or electrodes 136a and 136b on either lateral side of the beam path, as well as a voltage source 152 that provides alternating voltages to the electrodes 136a and 136b, as illustrated in the waveform diagram 160 of FIG. 2C.

The time-varying scan voltage between the scan electrodes 136a and 136b creates a time varying electric field across the beam path between the electrodes 136a and 136b, by which the beam 124 is bent or deflected (e.g., scanned) across the scan direction to provide a ribbon-shaped scanned ion beam 124 to the parallelizer 138 (FIG. 2A). When the scanning field is in the direction from the electrode 136a to the electrode 136b (e.g., the potential of electrode 136a is more positive than the potential of electrode 136b, such as at times "a" and "c" in FIG. 2C), the positively charged ions of the beam 124 are subjected to a lateral force in the negative X direction (e.g., toward the electrode 136b), wherein the converse is true when the scanning field is in the opposite direction.

Figure 2D:
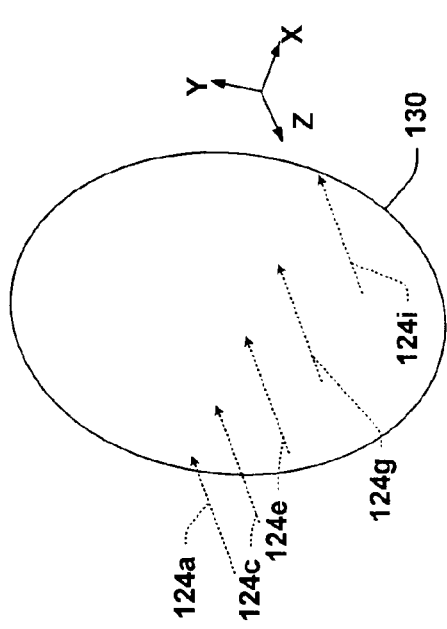
FIG. 2D is a perspective view illustrating a scanned ion beam striking a workpiece in the ion implantation system of FIGS. 2A and 2B at several discrete points in time.
Figure 2E:
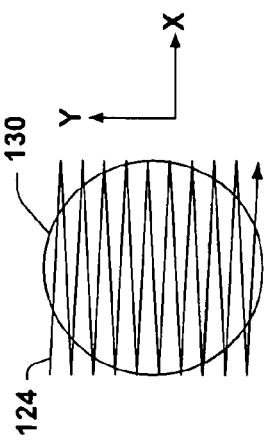
FIG. 2E is a side elevation view illustrating scanning of an ion beam across a workpiece in the ion implantation system of FIGS. 2A and 2B.
Figure 2C:
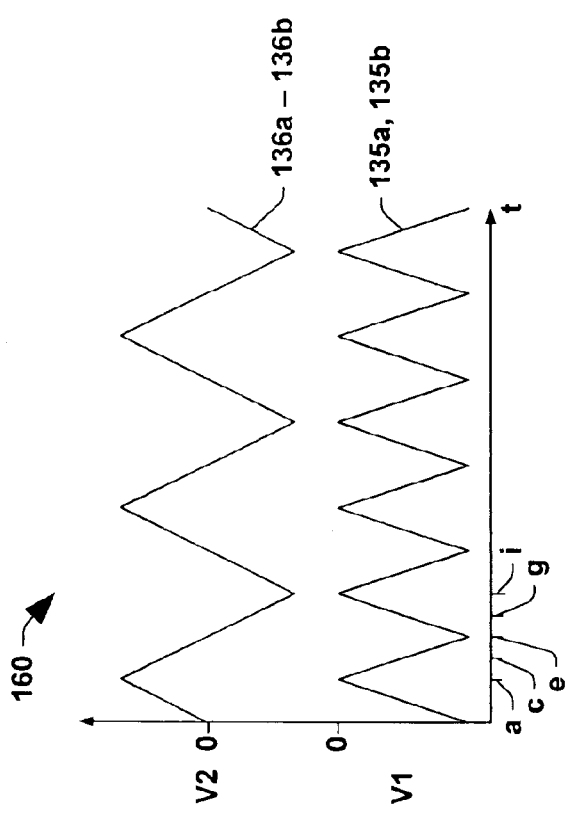
FIG. 2C is a graph illustrating scanning plate voltage waveforms and focus adjustment apparatus voltage waveforms in the scanner of FIGS. 2A and 2B in accordance with the invention.
Figure 2F:
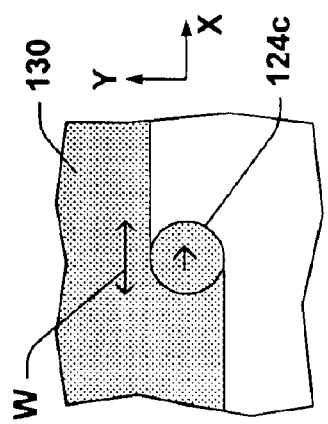
FIGS. 2F–2J are partial front elevation views illustrating more uniform ion beam width upon striking the workpiece in the ion implantation system of FIGS. 2A and 2B at several discrete points in time through operation of the exemplary focus adjustment apparatus of the invention.
Figure 2G:
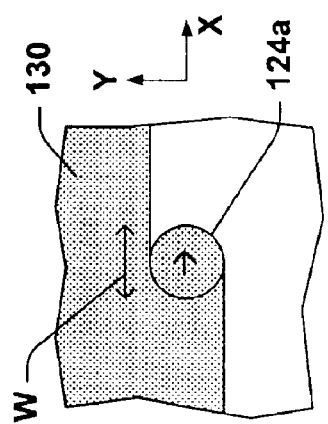
Figure 2H:
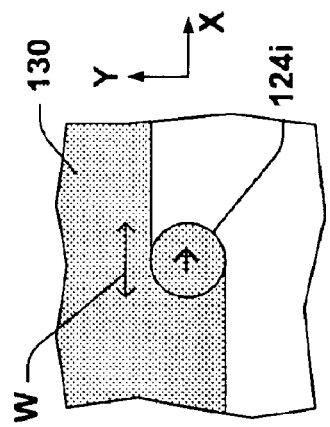
Figure 2I:
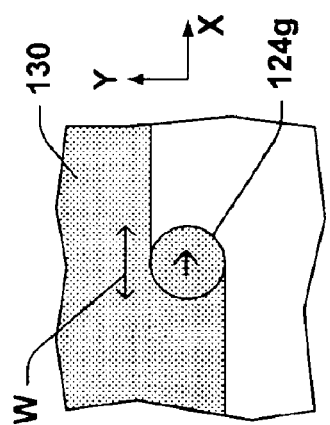
Figure 2J:
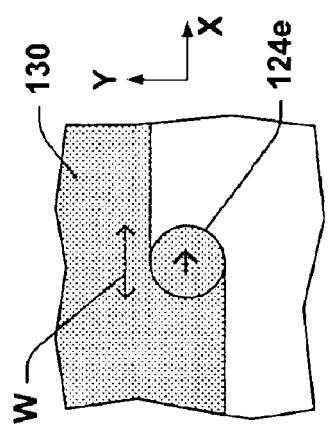

Referring also to FIGS. 2D and 2E, the focus adjusted beam 124 is thus scanned and parallelized in the scanner 136 and the parallelizer 138, respectively, and presented to the end station 116 to implant the workpiece 130 as it is translated in the positive Y direction. FIG. 2D illustrates the scanned and parallelized ion beam 124 impinging the workpiece 130 at several discrete times "a", "c", "e" "g", and "i" for a half cycle of the exemplary triangular scanning electrode waveform of the supply V2 152, with the corresponding times being indicated in the waveform diagram 160 of FIG. 2C. When the electrodes 136a and 136b are at the same potential (e.g., zero electric field in the scanner, such as at time "e" in FIG. 2C), the beam 124 passes through the scanner 135 essentially unmodified. When the field is in the direction from the electrode 136b to the electrode 136a (e.g., times "g" and "i" in FIG. 2C), the positively charged ions of the beam 124 are subjected to a lateral force in the positive X direction (e.g., toward the electrode 136a). When the scanning field is in the direction from the electrode 136a to the electrode 136b (e.g., times "a" and "c" in FIG. 2C), the ions of the beam 124 are subjected to a lateral force in the negative X direction (e.g., toward the electrode 136b).

As discussed above, the geometry and operating voltages of the scanner 136 provide certain focusing properties with respect to the ion beam 124, wherein the focal distance of the scanner 136 can be designed to provide a focal distance approximately equal to the distance from the effective vertex of the scanner 136 to the workpiece 130. However, absent the focus adjustment techniques and/or apparatus of the invention, the scanning operation changes the beam focusing, wherein a non-corrected beam would be focused only at one or two select portions of the beam path, for example, as illustrated above in FIGS. 1F–1J.

Figure 1D:
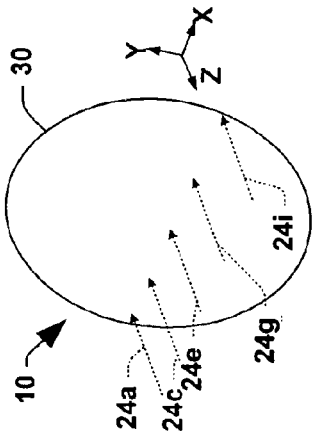
FIG. 1D is a perspective view illustrating a scanned ion beam striking a workpiece in the system of FIGS. 1A and 1B at several discrete points in time.
Figure 1C:
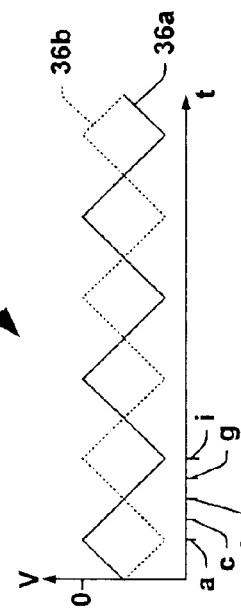
FIG. 1C is a graph illustrating scanning plate voltage waveforms in the scanner of FIGS. 1A and 1B.
Figure 1A:
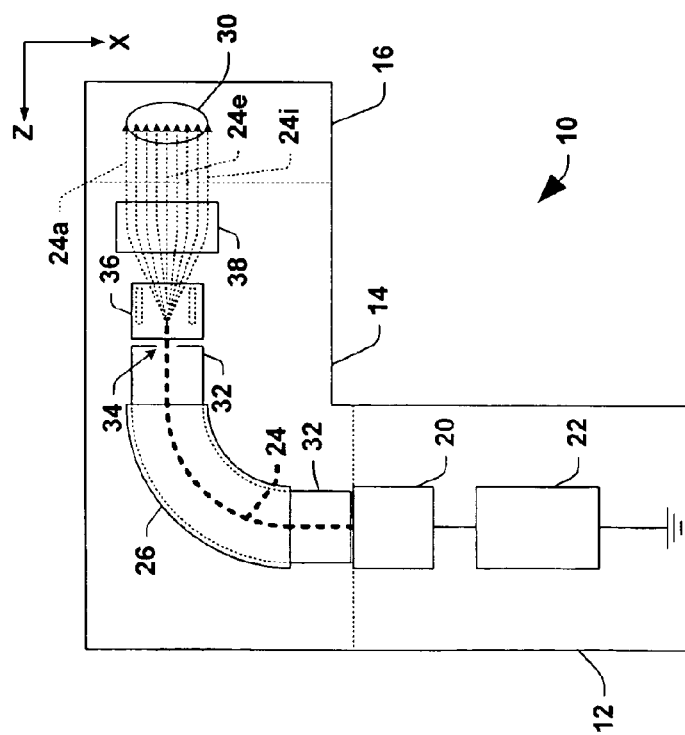
FIG. 1A is a schematic diagram illustrating an ion implantation system with a conventional scanner and parallelizer.
Figure 1E:
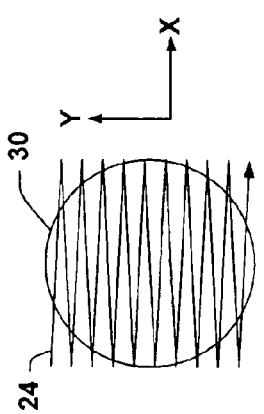
FIG. 1E is a side elevation view illustrating scanning of an ion beam across a workpiece.
Figure 1F:
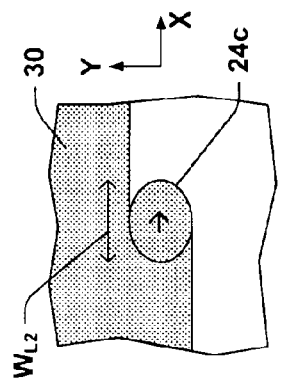
FIGS. 1F–1J are partial front elevation views illustrating variation in the ion beam width upon striking the workpiece due to time varying focal properties of the scanner in the ion implantation system of FIGS. 1A and 1B.
Figure 1G:
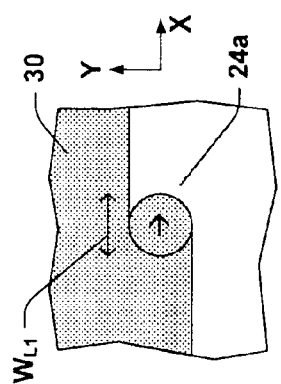
Figure 1H:
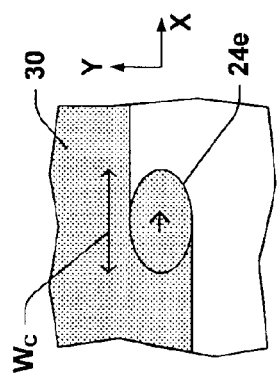
Figure 1I:
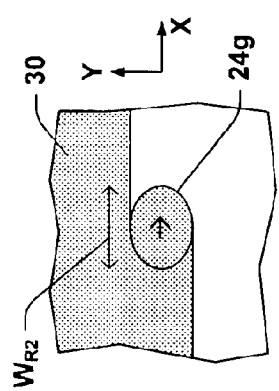
Figure 1J:
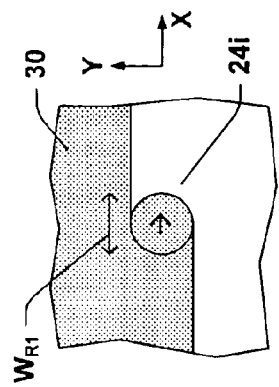

It is noted that in the above example, the scanner 135 is assumed to be designed such that absent focus adjustment of the present invention, the scanned ion beam is optimally focused at the lateral edges of the workpiece 130 (e.g., 124a and 124i in FIG. 2D), and that the worst case X-direction focusing occurs at the center (e.g., 124e in FIG. 1D). Alternatively, if the beam focus due to scanning differs from this exemplary relationship, the phase relationship between the time varying scan voltages at the scanning electrodes 136a and 136b and the time varying focus adjustment voltage at the adjustment electrodes 135a and 135b can be shifted by a suitable amount from that illustrated in FIG. 2C, wherein all such variant implementations are contemplated as falling within the scope of the invention and the appended claims.

Referring also to FIGS. 2F–2J, the exemplary focus adjustment apparatus 135 of the invention acts to counteract the time varying defocusing properties of the scanner 136, whereby the incident beam 124 is provided to the workpiece 130 having a generally uniform width W that is consistent across the scan direction (the X direction). FIGS. 2F–2J illustrate the incident beam 124 corresponding to the scanned instances 124a, 124c, 124e, 124g, and 124i, respectively, for the assumed case of an initially circular beam 124 (e.g., X and Y dimensions are approximately equal prior to entering the focus adjustment apparatus 135).

Although illustrated for the situation of a generally symmetrical circular mass analyzed ion beam 124 (e.g., pencil beam), the invention may be employed in association with beams 124 of any initial and final profiles. Moreover, although illustrated for the case of a single scan direction axis, the invention may be employed in ion implantations systems and scanning systems in which the beam 124 is scanned along more than one axis, wherein suitable focus adjustment apparatus and techniques may be employed to compensate for one or more focal properties of the scanning system, to provide focus adjustment in one direction and/or in multiple directions, wherein all such variant implementations are contemplated as falling within the scope of the present invention and the appended claims.

In the illustrated example, both the scanning voltage of the scanning electrodes 136a and 136b (e.g., V2 from power source 152 in FIGS. 2B, 2C, and 2K) as well as the focus adjustment voltage (e.g., V1 from the power source 151) are triangular waveforms, wherein the time varying scan voltage V2 is provided at a scan frequency to provide generally linear scanning of the beam 124 across the workpiece 130. Other time varying waveforms are possible within the scope of the invention, wherein the scan voltage waveform and the focus adjustment waveform may, but need not, be of the same shape, magnitude, etc. The focus adjustment power source 151, moreover, provides the time varying potential V1 at twice the scan frequency, as illustrated in FIG. 2C, although this is not a strict requirement of the invention. Furthermore, the focus adjustment voltage waveforms need not be symmetrical.

As illustrated in FIG. 2C, the exemplary focus adjustment waveform V1 is a time varying triangle shaped voltage provided to both the focus adjustment electrodes 135a and 135b, wherein the magnitude or amplitude of the adjustment voltage V1 determines the amount of focusing (e.g., the amount of convergence as the beam 124 exits the focus adjustment apparatus 135). The adjustment apparatus 135 effectively provides an adjusted or corrected focal distance that is determined by the voltage V1, the length and geometry of the adjustment electrodes 135a and 135b, and the ambient voltage potential near the entrance and exit of the apparatus 135 (e.g., ground in this example).

In the illustrated example, moreover, the adjustment voltage V1 is temporally correlated with the scanning voltage V2 such that when the scanning voltage V2 is maximum in either direction (e.g., at times "a" and "i" in FIG. 2C), the focus adjustment voltage V1 at the adjustment electrodes is minimum (e.g., close to or equal to the ambient potential), and when the scanning voltage V2 is minimum (e.g., equal to zero at time "e"), the focus adjustment voltage V1 is maximum. Thus, in the illustrated system 110 of FIGS. 2A–2J, as the scanner 136 scans the beam 124 along the X axis, the magnitude or amplitude of the time varying electric field of the focus adjustment apparatus 135 at a given time is related to a position of the scanned ion beam 124 along the scan direction axis. Although the minimum focus adjustment voltage is depicted as zero volts in the example of FIG. 2C, this is not a requirement of the invention. Furthermore, the focus adjustment voltage V1 need not be negative.

Figure 5:
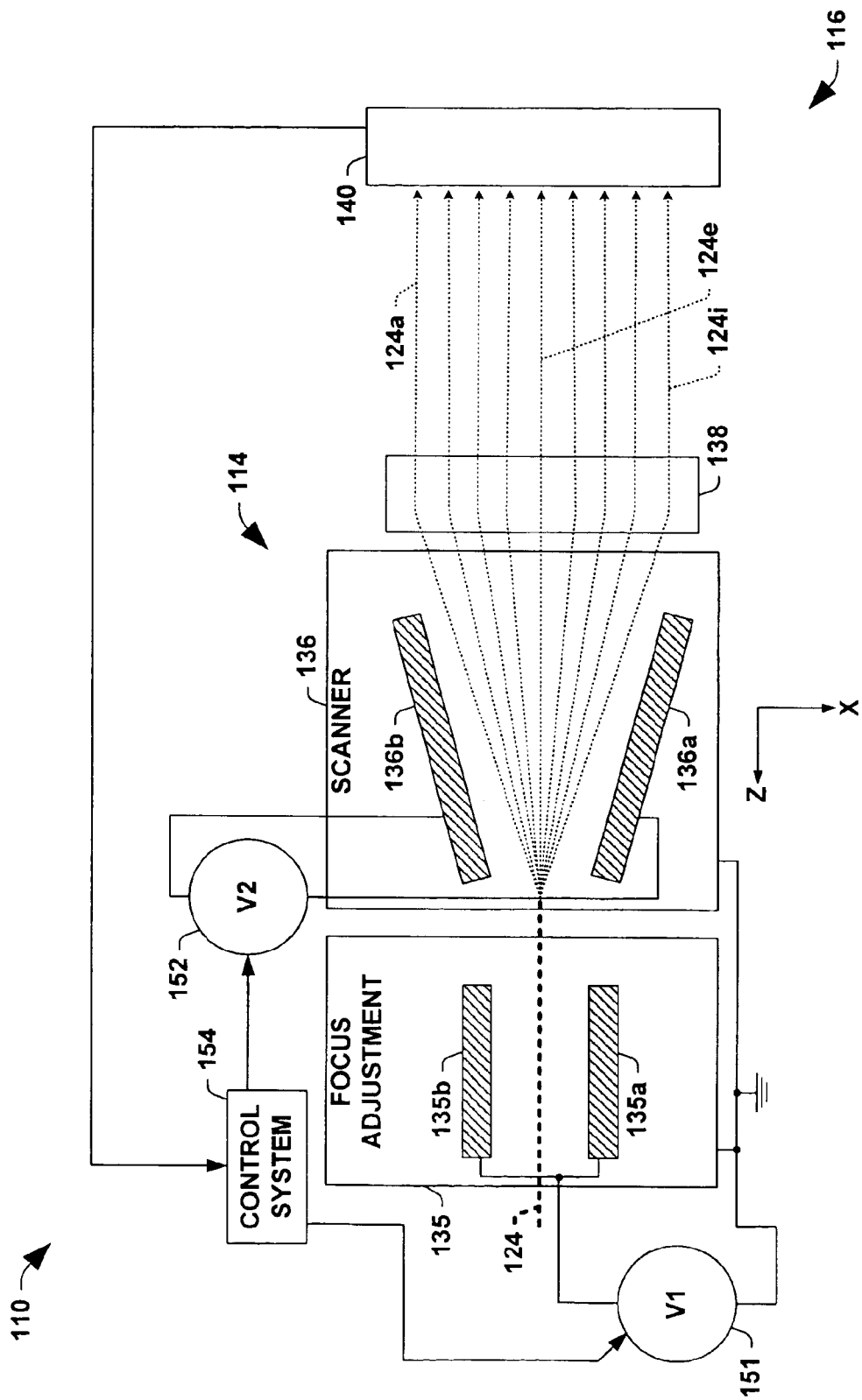
FIG. 5 is a top plan view illustrating the exemplary scanning system with a focus control apparatus and a beam profiler providing feedback one or more signals to a control system in accordance with the invention.

Referring also to FIG. 5, the system 110 may also employ feedback to adjust the adjustment voltage V1 with measured beam properties. In FIG. 5, a ribbon beam profiler 140 is installed along the path of the scanned and parallelized ion beam 124 to measure beam size and angles of incidence at the location where the workpiece 130 is normally mounted in the end station 116. Any suitable beam property measurement apparatus 140 may be employed, wherein an example of a suitable beam profiler 140 is described in International Publication Number WO 01/51183 A1 by Berrian, the entirety of which is hereby incorporated by reference as if fully set forth herein. In operation of the system 110 in FIG. 5, the profiler 140 can measure one or more properties of the ribbon beam 124 and provide one or more feedback signals or feedback information to the control system 154, which may then provide appropriate adjustments to the focus adjustment supply 151 to provide any desired final beam when used to implant a workpiece 130.

FIGS. 2L–2O illustrate several other possible implementations of the focus adjustment apparatus of the invention in the exemplary ion implantation system 110. In FIG. 2L, the focus adjustment apparatus 135 comprises a conductive Einzel lens (e.g., single lens electrode) 135d that extends around the ion beam path, as well as a power source V1 151 that provides a time varying potential to the Einzel lens 135d. As with the dual adjustment electrode example of FIGS. 2B and 2K above, the Einzel lens 135d is energized with a time varying voltage V1 as illustrated in FIG. 2C, and creates time varying electric fields at the entrance and exit thereof to dynamically adjust a focal property of the focus adjusted ion beam 124 that is provided to the scanner 136.

Figure 2N:
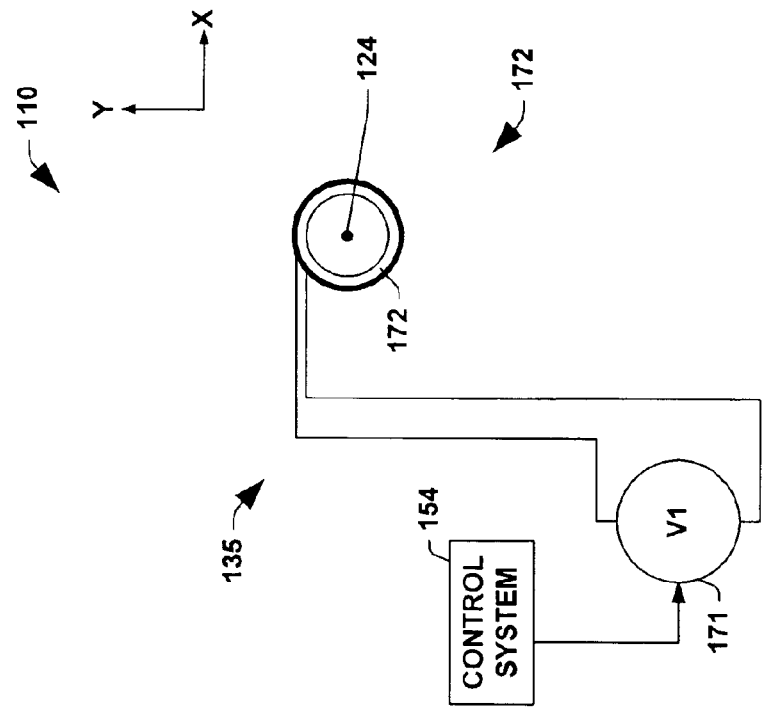
FIG. 2N is a simplified side elevation view illustrating another focus adjustment apparatus in accordance with the invention, comprising a solenoid.
Figure 2M:
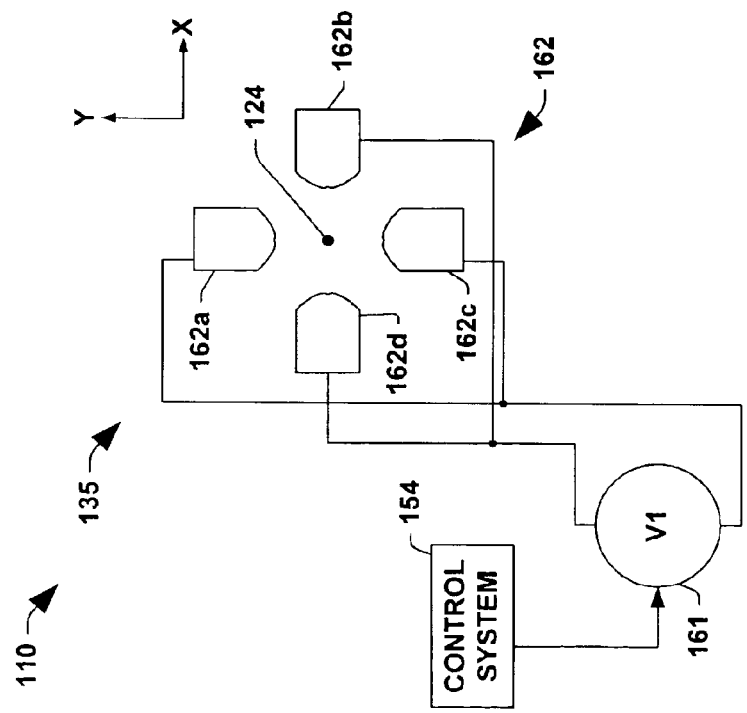
FIG. 2M is a simplified side elevation view illustrating another focus adjustment apparatus in accordance with the invention, comprising an electric quadrupole with four focus adjustment electrodes spaced from one another around the ion beam path.

Referring also to FIG. 2M, time varying electric focus adjustment fields may alternatively be created by any number of energized electrodes in the adjustment apparatus 135 upstream of the scanner 136. In the example of FIG. 2M, the focus adjustment apparatus 135 comprises an electric quadrupole 162 with four focus adjustment electrodes 162a–162d that are spaced from one another around the beam path. A power source V1 161 is coupled as illustrated to provide a time varying potential to at least two of the electrodes 162a–162d. For example, in FIG. 2M, the quadrupole electrodes 162a and 162c are energized together, and the electrodes 162b and 162d are energized together, wherein voltage potential V1 between adjacent electrodes is as illustrated in the waveform diagram 160 of FIG. 2C. In this regard, one pair of opposing electrodes may be held at ground or some other fixed potential while the remaining pair is provided with a time varying potential by the power source 161, or alternatively, all the electrodes 162a–162d may be energized to time varying potentials, wherein the focus adjustment voltage V1 between adjacent electrodes is a time varying triangular wave form at twice the scan frequency, as illustrated in FIG. 2C. In the example of FIG. 2M, when the electrodes 162a and 162c are negative with respect to the electrodes 162b and 162d, the beam 124 will tend to diverge in the Y direction and converge in the X direction, and vice versa when the supplied voltage potential reverses.

Figure 2O:
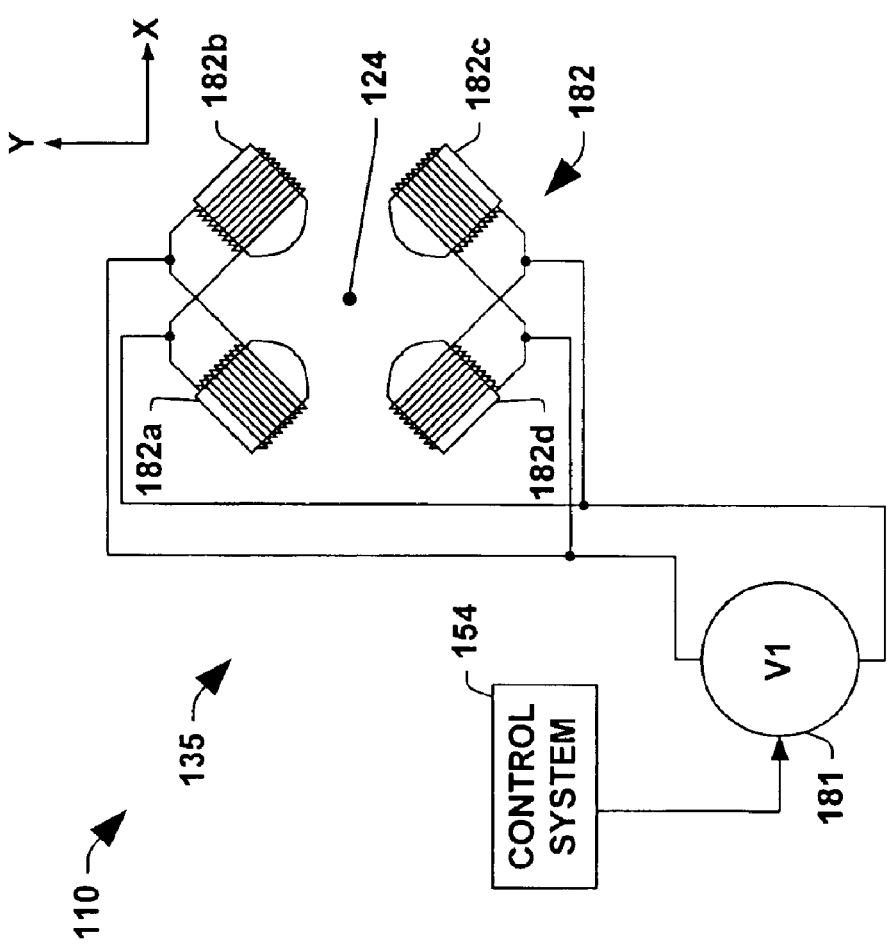
FIG. 2O is a simplified side elevation view illustrating another focus adjustment apparatus in accordance with the invention, comprising a magnetic quadrupole with four electromagnets spaced from one another around the ion beam path.

Referring to FIGS. 2N and 2O, in another aspect of the invention, the focus adjustment apparatus 135 generates one or more time varying magnetic fields proximate the mass analyzed ion beam 126 to dynamically adjust a focal property of the focus adjusted ion beam 124, thereby compensating for one or more time varying focal properties of the scanner 136. FIG. 2N illustrates one implementation of such a focus adjustment apparatus 135, comprising a solenoid 172 with windings encircling the beam path which operates to create a time varying magnetic field, wherein a power source 171 is coupled with the solenoid to provide time varying current to the solenoid. As with the time varying electric field examples above, the power source 171 provides time varying current to the solenoid 172, wherein the source 171 may apply a generally triangular voltage waveform that reverses the current supplied to the solenoid 172 at twice the scan frequency of the scanner 136.

Another exemplary implementation is illustrated in FIG. 2O, in which the focus adjustment apparatus 135 comprises a quadrupole magnet 182 having four electromagnets 182a–182d spaced from one another around the beam path, as well as a power source 181 providing time varying currents to the electromagnets 182a–182d at twice the scan frequency of the scanner 136. As with the electric field implementations above, the electromagnet currents provided by the power sources 171 and 181 in FIGS. 2N and 2O are adjusted to provide one or more time varying magnetic fields having a magnitude at a given time that is related to a position of the scanned ion beam 124 along the scan direction axis, such as triangular waveforms at twice the scan frequency.

When the polarity of the currents through the electromagnets 182a–182d are such that magnetic North poles are facing the beam 124 from the magnets 182a and 182c and magnetic South poles face the beam 124 from magnets 182b and 182d, the quadrupole 182 will provide divergence of the beam 124 in the Y direction and convergence in the X direction. When the currents from the power source 181 provide magnetic North poles at the magnets 182b and 182d and magnetic South poles at the magnets 182a and 182c, the beam 124 converges in the Y direction and diverges in the X direction. In the illustrated example, the power source 181 provides time varying voltages to the coils of the electromagnets 182a–182d generally as illustrated in FIG. 2C (V2 alternating waveform in FIG. 2C) to establish time varying coil currents at twice the scan frequency, whereby the resulting time varying magnetic fields have a magnitude at a given time that is related to a position of the scanned ion beam 124 along the scan direction axis.

The focus adjustment apparatus of the present invention may be employed in conjunction with any type of scanning apparatus. For example, while the scanner 136 in the exemplary system 110 is an electric scanner using electric field modulation to create the scanned ion beam 124, magnetic field modulating scanners or other scanning mechanisms are also possible, wherein all such alternative implementations of scanners are contemplated as falling within the scope of the invention.

Another aspect of the invention provides methods for providing a scanned ion beam to a workpiece, which may be practiced in the systems illustrated and described herein, as well as in other systems. The methods comprise providing an ion beam along a beam path, dynamically adjusting a focal property of the ion beam, scanning the ion beam to create a scanned ion beam, and directing the scanned ion beam toward a workpiece. For example, in the exemplary system 110 of FIGS. 2A and 2B, a mass analyzed ion beam 124 is presented to the focus adjustment apparatus 135 by the mass analyzer 126, which dynamically adjusts the X direction focusing of the beam 124, for example, by providing time varying electric and/or magnetic fields near the beam 124, as described above. The focus adjusted beam 124 is then provided to the scanner 136, which scans the beam 124 to create a scanned ion beam 124, which is then directed to the workpiece 130 by the scanner 136 or by the scanner 136 and the parallelizer 138.

Figure 3C:
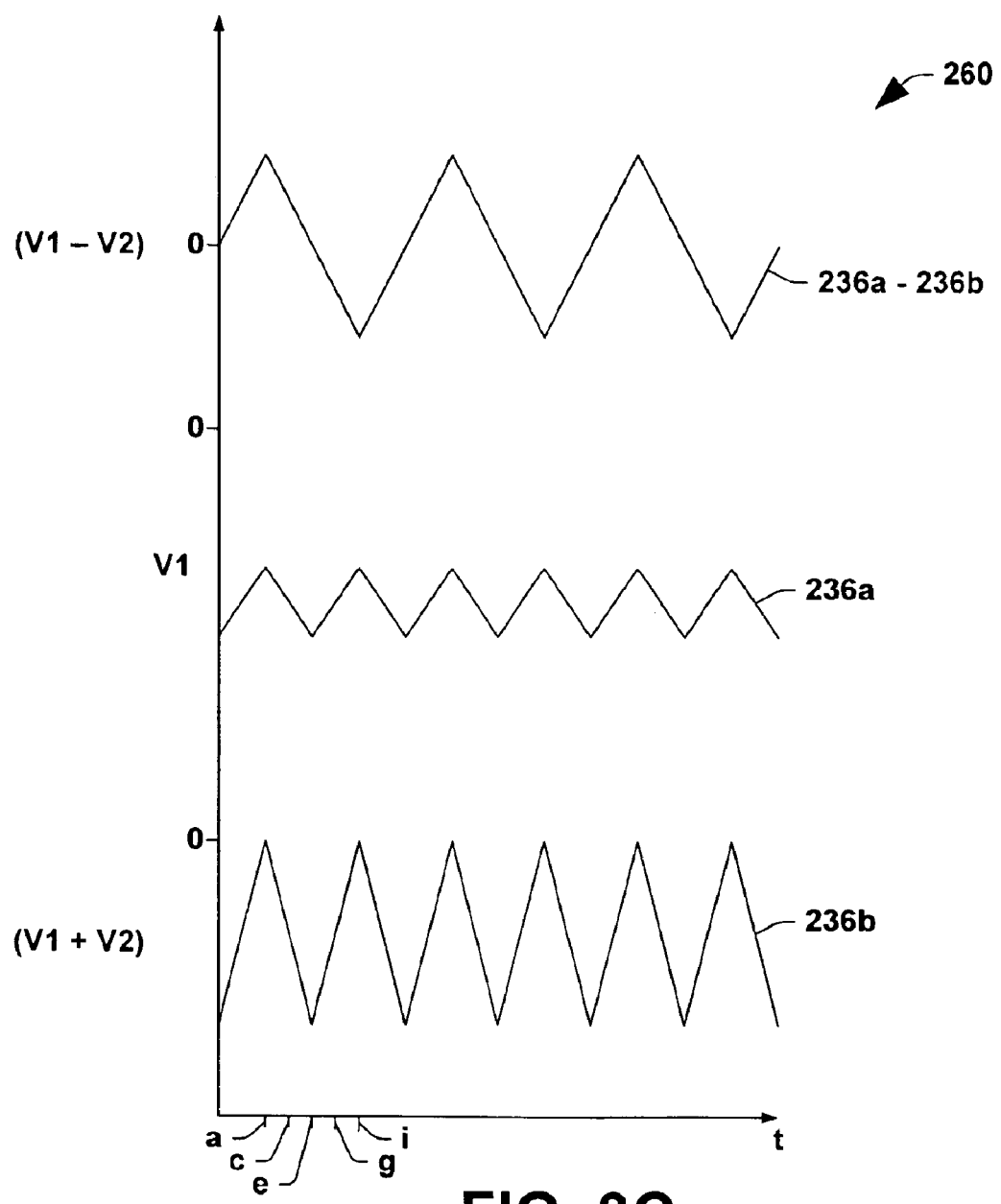
FIG. 3C is a graph illustrating scanning plate voltage waveforms in the scanning system of FIGS. 3A and 3B in accordance with the invention.

Referring now to FIGS. 3A–3C, according to another aspect of the invention, the focus adjustment apparatus may comprise a power source coupled with the scanner to provide a time varying common mode potential to the scanner electrodes. FIG. 3A illustrates another exemplary low energy ion implantation system 210 in accordance with the invention, comprising a terminal 212 with an ion source 220 and a power supply 222 to provide an extracted ion beam 224 to a beamline assembly 214 that comprises a beamguide 232 with an exit end resolving aperture 234, a mass analyzer 226, a scanner 236, and a parallelizer 238. The system 210 further comprises an end station 216 that supports one or more workpieces 230 for implantation.

As further illustrated in FIGS. 3B and 3C, the scanning system in the beamline assembly 214 includes a scanner 236 comprising first and second scan electrodes 236a and 236b on either lateral side of the beam path and a scan power source V2 252 providing time varying scan voltages at a scan frequency to the electrodes 236a and 236b. The scanning system further includes a focus adjustment apparatus, which in this example comprises another power source V1 251 that provides a time varying common mode potential at twice the scan frequency to the scanner electrodes 236a and 236b.

FIG. 3C illustrates a waveform diagram 260 showing exemplary waveforms in the system 110 of FIGS. 3A and 3B. The voltage potential difference between the electrodes 236a and 236b (e.g., (V1–V2) in FIG. 3C) is a time varying triangular waveform to provide a time varying electric field between the electrodes 236a and 236b for scanning the ion beam 224 in the X direction at the scan frequency. The focus adjustment power source 251 creates a triangular offset or common mode voltage at twice the scan frequency at the electrode 236a (e.g., V1 in FIG. 3C) which is also used to offset the power source 252, whereby the voltage V1+V2 at the second scan electrode 236b is also a triangular waveform at twice the scan frequency. In this regard, the average voltage of both electrodes 236a and 236b with respect to ground (e.g., (V1+V2)/2) is a triangular waveform that provides time varying focal length adjustment, while the potential difference between the electrodes 236a and 236b (e.g., (V1–V2) in FIG. 3C) is a time varying triangular waveform at the scan frequency to perform the scanning function.

The provision of the time varying offset or common mode voltage to the scan electrodes 236a and 236b operates to create time varying electric fields (e.g., also at twice the scan frequency) proximate the beam 224 at the entrance and exit regions of the scanner 236 that provide adjustment of one or more focal properties of the beam 224 to compensate for one or more focal properties of the scanner 236. As in the above examples, moreover, the power source 251 may be programmed or controlled by a control system 254 to provide the offset or common mode adjustment voltage so as to create the time varying focus adjustment electric fields having a magnitude at a given time that is related to a position of the scanned ion beam 224 along the scan direction axis.

Referring also to FIGS. 4A and 4B, another possible implementation of the invention is illustrated, wherein first and second power sources 251 and 252 are coupled to the scan electrodes 236a and 236b, respectively (FIG. 4A), and are configured or controlled to provide the waveforms V1 and V2, respectively (FIG. 4B). In this configuration, the focus adjustment apparatus comprises the sources 251 and 252, which operate to provide time varying focus adjustment electric fields at the entrance and exit of the scanner 236 at twice the scan frequency with a magnitude related to a position of the scanned ion beam 224 along the X axis, and which also provide a time varying scan potential at the scan frequency between the electrodes 236a and 236b for time varying electric scanning of the beam 224 along the X direction.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An ion implantation system, comprising:
    an ion source operable to produce an extracted ion beam;
    a mass analyzer receiving the extracted ion beam from the ion source and providing a mass analyzed ion beam comprising ions of a desired mass range;
    a focus adjustment apparatus receiving the mass analyzed ion beam along a beam path from the mass analyzer and providing a focus adjusted ion beam along the beam path; and
    a scanner receiving the focus adjusted ion beam from the focus adjustment apparatus and directing a scanned ion beam toward a workpiece;
    wherein the focus adjustment apparatus dynamically adjusts a focal property of the focus adjusted ion beam to compensate for at least one time varying focal property of the scanner.

2. The ion implantation system of claim 1, wherein the focus adjustment apparatus generates at least one time varying electric field proximate the mass analyzed ion beam that dynamically adjusts the focal property of the focus adjusted ion beam.

3. The ion implantation system of claim 2, wherein the focus adjustment apparatus comprises:
    an Einzel lens; and
    a power source coupled with the Einzel lens that provides a time varying potential to the Einzel lens.

4. The ion implantation system of claim 2, wherein the focus adjustment apparatus comprises:
    at least two focus adjustment electrodes spaced from one another on opposite sides of the beam path; and
    a power source coupled with the focus adjustment electrodes that provides a time varying potential to the focus adjustment electrodes.

5. The ion implantation system of claim 4, wherein the scanner scans the focus adjusted ion beam along a scan direction axis generally perpendicular to the beam path, and wherein the focus adjustment electrodes extend along a direction parallel to the beam path and are spaced from one another in a direction parallel with the scan direction axis.

6. The ion implantation system of claim 2, wherein the focus adjustment apparatus comprises:
    an electric quadrupole with four focus adjustment electrodes spaced from one another around the beam path; and
    a power source coupled with the focus adjustment electrodes that provides a time varying potential to at least two of the focus adjustment electrodes.

7. The ion implantation system of claim 2, wherein the scanner scans the focus adjusted ion beam at a scan frequency, and wherein the focus adjustment apparatus generates the at least one time varying electric field at twice the scan frequency.

8. The ion implantation system of claim 2, wherein the scanner scans the focus adjusted ion beam along a scan direction axis generally perpendicular to the beam path, and wherein a magnitude of the time varying electric field at a given time is related to a position of the scanned ion beam along the scan direction axis.

9. The ion implantation system of claim 1, wherein the scanner scans the focus adjusted ion beam along a scan direction axis generally perpendicular to the beam path, and wherein the focus adjustment apparatus adjusts the focal property of the focus adjusted ion beam by an amount related to a position of the scanned ion beam along the scan direction axis.

10. The ion implantation system of claim 1, wherein the focus adjustment apparatus generates at least one time varying magnetic field proximate the mass analyzed ion beam that dynamically adjusts the focal property of the focus adjusted ion beam.

11. The ion implantation system of claim 10, wherein the focus adjustment apparatus comprises a solenoid.

12. The ion implantation system of claim 10, wherein the focus adjustment apparatus comprises;
    a quadrupole magnet having four electromagnets spaced from one another around the beam path; and
    a power source coupled with the electromagnets that provides time varying currents to the electromagnets.

13. The ion implantation system of claim 10, wherein the scanner scans the focus adjusted ion beam at a scan frequency, and wherein the focus adjustment apparatus generates the at least one time varying magnetic field at twice the scan frequency.

14. The ion implantation system of claim 11, wherein the scanner scans the focus adjusted ion beam along a scan direction axis generally perpendicular to the beam path, and wherein a magnitude of the time varying magnetic field at a given time is related to a position of the scanned ion beam along the scan direction axis.

15. The ion implantation system of claim 1, wherein the scanner comprises at least two scan electrodes spaced from one another on opposite sides of the beam path that provide a time varying electric scan field along a portion of the beam path to scan the ion beam along a scan direction axis, and wherein the focus adjustment apparatus comprises a power source that provides a time varying common mode potential to both scan electrodes.

16. The ion implantation system of claim 1, further comprising a beam property measurement apparatus adapted to measure one or more properties of the ion beam and to provide one or more feedback signals to the focus adjustment apparatus, wherein the focus adjustment apparatus dynamically adjusts the focal property of the focus adjusted ion beam according to the one or more feedback signals from the beam property measurement apparatus.

17. A scanning system for providing a scanned ion beam to a workpiece in an ion implantations system, the scanning system comprising:
 a scanner receiving a mass analyzed ion beam along a beam path and directing a scanned ion beam toward a workpiece; and
 a focus adjustment apparatus that dynamically adjusts a focal property of the scanned ion beam to compensate for at least one time varying focal property of the scanner.

18. The scanning system of claim 17, wherein the scanner comprises at least two scan electrodes spaced from one another on opposite sides of the beam path that provide a time varying electric scan field along a portion of the beam path to scan the ion beam along a scan direction axis, and wherein the focus adjustment apparatus comprises a power source that provides a time varying common mode potential to both scan electrodes.

19. The scanning system of claim 18, wherein the scanner scans the focus adjusted ion beam at a scan frequency, and wherein the power source provides the time varying common mode potential at twice the scan frequency.

20. The scanning system of claim 19, wherein a magnitude of the time common mode potential at a given time is related to a position of the scanned ion beam along the scan direction axis.

21. The scanning system of claim 18, wherein a magnitude of the time common mode potential at a given time is related to a position of the scanned ion beam along the scan direction axis.

22. The scanning system of claim 17, wherein the focus adjustment apparatus generates at least one time varying electric field that dynamically adjusts the focal property of the ion beam.

23. The scanning system of claim 22, wherein the focus adjustment apparatus comprises:
 an Einzel lens located upstream from the scanner along the beam path; and
 a power source coupled with the Einzel lens that provides a time varying potential to the Einzel lens.

24. The scanning system of claim 22, wherein the focus adjustment apparatus comprises:
 at least two focus adjustment electrodes spaced from one another on opposite sides of the beam path upstream from the scanner; and
 a power source coupled with the focus adjustment electrodes that provides a time varying potential to the focus adjustment electrodes.

25. The scanning system of claim 24, wherein the scanner scans the focus adjusted ion beam along a scan direction axis generally perpendicular to the beam path, and wherein the focus adjustment electrodes extend along a direction parallel to the beam path and are spaced from one another in a direction parallel with the scan direction axis.

26. The scanning system of claim 22, wherein the focus adjustment apparatus comprises:
 an electric quadrupole with four focus adjustment electrodes spaced from one another around the beam path upstream from the scanner; and a power source coupled with the focus adjustment electrodes that provides a time varying potential to at least two of the focus adjustment electrodes.

27. The scanning system of claim 22, wherein the scanner scans the ion beam at a scan frequency, and wherein the focus adjustment apparatus generates at least one time varying electric field at twice the scan frequency.

28. The scanning system of claim 22, wherein the scanner scans the focus adjusted ion beam along a scan direction axis generally perpendicular to the beam path, and wherein a magnitude of the at least one time varying electric field at a given time is related to a position of the scanned ion beam along the scan direction axis.

29. The scanning system of claim 17, wherein the scanner scans the focus adjusted ion beam along a scan direction axis generally perpendicular to the beam path, and wherein the focus adjustment apparatus adjusts the focal property of the scanned ion beam by an amount related to a position of the scanned ion beam along the scan direction axis.

30. The scanning system of claim 17, wherein the focus adjustment apparatus generates at least one time varying magnetic field that dynamically adjusts the focal property of the ion beam.

31. The scanning system of claim 30, wherein the focus adjustment apparatus comprises a solenoid.

32. The scanning system of claim 30, wherein the focus adjustment apparatus comprises;
 a quadrupole magnet having four electromagnets spaced from one another around the beam path; and
 a power source coupled with the electromagnets that provides time varying currents to the electromagnets.

33. The scanning system of claim 30, wherein the scanner scans the ion beam at a scan frequency, and wherein the focus adjustment apparatus generates the at least one time varying magnetic field at twice the scan frequency.

34. The scanning system of claim 30, wherein the scanner scans the focus adjusted ion beam along a scan direction axis generally perpendicular to the beam path, and wherein a magnitude of the time varying magnetic field at a given time is related to a position of the scanned ion beam along the scan direction axis.

35. The scanning system of claim 17, wherein the scanner provides a time varying electric scan field along a portion of the beam path to scan the ion beam along a scan direction axis.

36. A scanning system for providing a scanned ion beam to a workpiece in an ion implantations system, the scanning system comprising:
 a scanner receiving a mass analyzed ion beam along a beam path and directing a scanned ion beam toward a workpiece; and
 means for dynamically adjusting a focal property of the scanned ion beam to compensate for at least one time varying focal property of the scanner.

37. A method of providing a scanned ion beam to a workpiece, the method comprising:
 providing a mass analyzed ion beam along a beam path;
 dynamically adjusting a focal property of the ion beam according to an ion beam scan position;
 scanning the ion beam to create a scanned ion beam; and
 directing the scanned ion beam toward a workpiece.

38. The method of claim 37, wherein dynamically adjusting the focal property of the ion beam comprises generating at least one time varying electric field proximate the ion beam.

39. The method of claim 38, wherein scanning the ion beam is done at a scan frequency, and wherein dynamically adjusting a focal property of the ion beam comprises generating the at least one time varying electric field at twice the scan frequency.

40. The method of claim 38, wherein the ion beam is scanned along a scan direction axis, and wherein a magnitude of the time varying electric field is related to a position of the scanned ion beam along the scan direction axis.

41. The method of claim 37, wherein scanning the ion beam is done at a scan frequency, and wherein dynamically adjusting a focal property of the ion beam is done at twice the scan frequency.

42. The method of claim 37, wherein the ion beam is scanned along a scan direction axis, and wherein the focal property of the ion beam is dynamically adjusted by an amount related to a position of the scanned ion beam along the scan direction axis.

43. The method of claim 37, wherein dynamically adjusting the focal property of the ion beam comprises generating at least one time varying magnetic field proximate the ion beam.

44. The method of claim 43, wherein scanning the ion beam is done at a scan frequency, and wherein dynamically adjusting a focal property of the ion beam comprises generating the at least one time varying magnetic field at twice the scan frequency.

45. The method of claim 43, wherein the ion beam is scanned along a scan direction axis, and wherein a magnitude of the time varying magnetic field is related to a position of the scanned ion beam along the scan direction axis.

* * * * *